United States Patent
Kim et al.

(10) Patent No.: US 8,890,738 B2
(45) Date of Patent: Nov. 18, 2014

(54) TIME-TO-DIGITAL CONVERTER AND CONVERSION METHOD

(75) Inventors: Tae Wook Kim, Seoul (KR); Yeomyung Kim, Seoul (KR); Gunhee Han, Gyeonggi-do (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 14/110,192

(22) PCT Filed: Apr. 4, 2012

(86) PCT No.: PCT/KR2012/002526
§ 371 (c)(1),
(2), (4) Date: Oct. 23, 2013

(87) PCT Pub. No.: WO2012/141451
PCT Pub. Date: Oct. 18, 2012

(65) Prior Publication Data
US 2014/0292552 A1    Oct. 2, 2014

(30) Foreign Application Priority Data

Apr. 5, 2011   (KR) ........................ 10-2011-0031310

(51) Int. Cl.
*H03M 1/12* (2006.01)
*G04F 10/00* (2006.01)
*H03M 1/00* (2006.01)
*H04L 7/033* (2006.01)

(52) U.S. Cl.
CPC .............. *G04F 10/005* (2013.01); *G04F 10/00* (2013.01); *H03M 1/00* (2013.01); *H04L 7/033* (2013.01); *H03M 1/1225* (2013.01); *H03M 2201/4233* (2013.01); *H03M 1/12* (2013.01)
USPC .......................................... 341/156; 341/166

(58) Field of Classification Search
CPC . H03M 1/00; H03M 1/12; H03M 2201/4233; H03M 1/1225; H04L 7/033; G04F 10/00; G04F 10/005
USPC .......... 341/156, 166, 141, 157, 155; 375/376; 702/178
See application file for complete search history.

(56) References Cited

U.S. PATENT DOCUMENTS

| 7,522,084 B2 | 4/2009 | Huang et al. |
| 7,649,969 B2 | 1/2010 | Parker |

(Continued)

FOREIGN PATENT DOCUMENTS

| JP | H10-190423 A | 7/1998 |
| KR | 10-2007-0027787 A | 3/2007 |
| KR | 10-2010-0099754 A | 9/2010 |

OTHER PUBLICATIONS

International Search Report issued in corresponding application No. PCT/KR2012/002526 mailed Sep. 28, 2012.

*Primary Examiner* — Joseph Lauture
(74) *Attorney, Agent, or Firm* — Carter, DeLuca, Farrell & Schmidt, LLP

(57) ABSTRACT

The present disclosure provides a time-to-digital (TDC) converter, comprising: a coarse TDC receiving a start signal and a stop signal, delaying the first start signal in a first time unit to generate n first delayed start signals (where n is an integer equal to or larger than 2), measuring a time difference between the first delayed start signal and the stop signal in the first time unit, and generating second delayed start signals that are obtained by delaying the first delayed start signals in a time unit shorter than the first time unit; and a fine TDC receiving and delaying the second delayed start signal generated from the coarse TDC and receiving the stop signal, and measuring a time difference between the second delayed start signal and the stop signal in a second time unit.

14 Claims, 17 Drawing Sheets

(56) References Cited

U.S. PATENT DOCUMENTS

| | | | |
|---|---|---|---|
| 7,932,847 B1 * | 4/2011 | Hsieh et al. | 341/155 |
| 7,973,578 B2 | 7/2011 | Oh et al. | |
| 7,999,707 B2 | 8/2011 | Park et al. | |
| 8,325,076 B2 | 12/2012 | Yousif et al. | |
| 8,447,548 B2 | 5/2013 | Mckay et al. | |

* cited by examiner

TIME-TO-DIGITAL CONVERTER AND CONVERSION METHOD

CROSS-REFERENCE TO RELATED APPLICATIONS

This U.S. non-provisional patent application claims priority under 35 U.S.C. §119 of Korean Patent Application No. 10-2011-0031310, filed on Apr. 5, 2011, the entire contents of which are hereby incorporated by reference.

TECHNICAL FIELD

The present invention disclosed herein relates to a time-digital converter and a conversion method.

BACKGROUND ART

A time to digital converter (TDC) is a device converting time information into digital codes. The TDC generates digital codes corresponding to the time difference between two input signals. Such a TDC is used in an analog to digital converter (ADC), a phase locked loop (PLL), a delay locked loop (DLL), an image sensor, a shape scanning device, a distance measurement device, etc.

DISCLOSURE OF THE INVENTION

Technical Problem

The present invention provides a time to digital converter that ensures a high operating speed and high accuracy and enhances reliability by maintaining linearity.

Technical Solution

Embodiments of the present invention provide time to digital converters (TDC) including: a coarse TDC receiving a start signal and a stop signal, delaying the first start signal in a first time unit to generate n first delayed start signals (where n is an integer equal to or larger than 2), measuring a time difference between the first delayed start signal and the stop signal in first time unit, and generating second delayed start signals that are obtained by delaying the first delayed start signals in a time unit shorter than the first time unit; and a fine TDC receiving and delaying the second delayed start signal generated from the coarse TDC and the stop signal, and measuring a time difference between the second delayed start signal and the stop signal in a second time unit.

In some embodiments, the coarse TDC may include 2n delay cells (where n is an integer equal to or larger than 2) delaying the start signal in time unit of half of the first time unit, and n coarse bit detectors (where n is equal to or larger than 2) that are connected between n pairs of delay cells (where n is equal to or larger than 2) paired by two neighboring delay cells of the delay cells to delay the start signal in the first time unit and determine a value of an output bit according to a logic level of the first delayed start signal and the stop signal, and the second delayed start signal may be output from each of nodes between the two delay cells forming the pairs of delay cells.

In other embodiments, the first time unit may be larger than the second time unit.

In still other embodiments, when an output bit from a kth coarse bit detector of the n bit detectors (k≤n, where k is equal to or larger than 2) is '1', a second delayed start signal further delayed in time unit of half of the first time unit from the kth first delayed start signal may be provided to the fine TDC.

In even other embodiments, the fine TDC may include a first delay line and a second delay line comprising n delay cells (where n is equal to or larger than 2), the first delay line may delay the stop signal in a third time unit to generate n delayed stop signals (where n is equal to or larger than 2), and the second delay line may delay the second delayed start signal in fourth time unit to generate n third delayed start signals (where n is equal to or larger than 2).

In yet other embodiments, the third time unit may be larger than the fourth time unit and a time difference between the third time unit and the fourth time unit may be the second time unit.

In further embodiments, the fine TDC further may include n fine bit detectors generating an output bit according to logic levels of the delayed stop signal and the third delayed start signal.

In still further embodiments, the time to digital converter may further include a first encoder receiving an output bit from the coarse TDC and outputting a coarse time; a second encoder receiving an output bit from the fine TDC and outputting a fine time; and an adder outputting a time difference between the start signal and the stop signal by using the coarse time and the fine time.

In other embodiments of the present invention, time to digital conversion methods including (a) providing a start signal to a coarse TDC and delaying the start signal in a first time unit to generate a first delayed start signal; (b) generating, at the coarse TDC, a first output bit according to a logic level of the first delayed start and a stop signal; (c) delaying the first delayed start signal at the coarse TDC to generate a second delayed start signal; (d) providing the stop signal to a first delay line of a fine TDC and delaying the stop signal in a third time unit to generate a delayed stop signal; (e) providing the second delayed start signal to a second delay line of the fine TDC and delaying the second delayed start signal in a fourth time unit to generate a third delayed start signal; and (f) generating a second output bit according to a logic level of the third delayed start signal and the delayed stop signal.

In some embodiments, the delaying of the first delayed start signal to generate the second delayed start signal may include delaying the first delayed start signal in units of time shorter than the first time unit.

In other embodiments, the third time unit in (d) may be longer than the fourth time unit in (e).

In still other embodiments of the present invention, time to digital converters (TDC) configured by combining a coarse TDC with a fine TDC are provided, wherein the coarse TDC includes 2n first delay cells (where n is equal to or larger than 2); and a coarse bit detector connected between a pair of delay cell formed as two neighboring first delay cells, and the fine TDC comprises a first delay line comprising n second delay cells (where n is equal to or larger than 2); a second delay line comprising n third delay cells (where n is equal to or larger than 2); and n fine bit detectors, each of which is connected to the second delay cell and the third delay cell, a start signal being input to the first delay cell, a stop signal being input to the coarse bit detector and the first delay line, the second delay line being connected to a node between two first delay cells forming a pair of delay cells for the coarse TDC.

In some embodiments, a time delayed by the second delay cell may be longer than a time delayed by the third delay cell.

In other embodiments, a difference between a time delayed by the second delay cell and a time delayed by the third delay cell may be smaller than a time delayed by the first delay cell.

Advantageous Effects

A time to digital converter (TDC) according to embodiments of the present invention combines a coarse TDC with a fine TDC to ensure a high operating speed and high accuracy.

The TDC according to embodiments of the present invention may expand the measurement range of the fine TDC to maintain linearity and enhance reliability.

MODE FOR CARRYING OUT THE INVENTION

The present invention may be embodied in different forms and should not be construed as limited to the embodiments set forth herein. Rather, these embodiments are provided so that this disclosure will be thorough and complete, and will fully convey the scope of the present invention to those skilled in the art.

It will be understood that although the terms first and second are used herein to describe various elements, these elements should not be limited by these terms. The terms first and second mentioned in the embodiments are distinguished from a first and a second. The terms are used only in order to distinguish a component from another component.

Hereinafter, embodiments of the present invention will be described with reference to the accompanying drawings to fully explain the present invention in such a manner that it may easily be carried out by a person with ordinary skill in the art to which the present invention pertains.

A time to digital converter (TDC) according to an embodiment of the present invention may be applied to an analog to digital converter (ADC), a phase locked loop (PLL), a delay locked loop (DLL), an image sensor, a shape scanning device, a distance measurement device, etc.

The TDC will be exemplarily described below with respect to time measurement.

Figure 1:
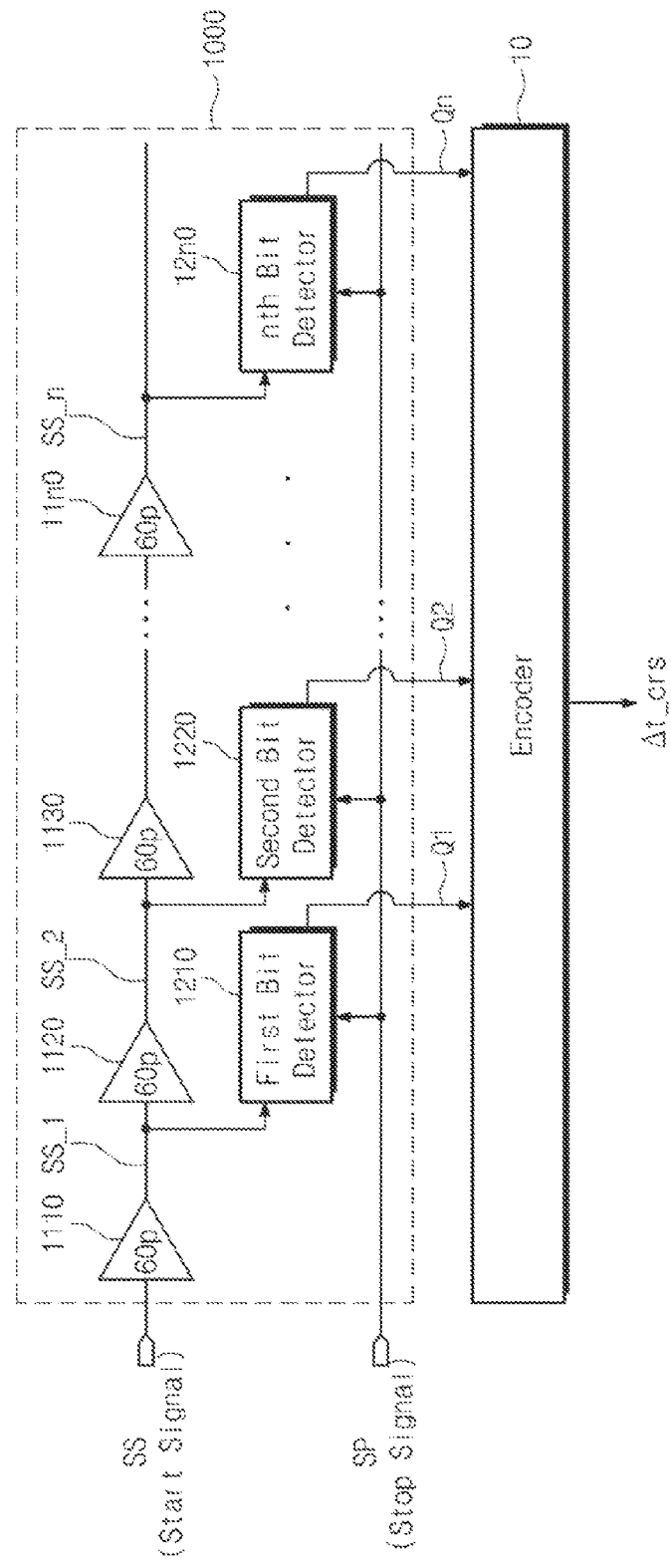
FIG. 1 shows a time to converter (TDC) 100 according to a first embodiment of the present invention and a time measurement device having the same.

FIG. 1 shows a TDC 1000 according to a first embodiment of the present invention and a time measurement device having the same. In FIG. 1, a time measurement device includes the TDC 1000 and an encoder 10. The TDC 1000 of FIG. 1 is referred to as a coarse TDC below. The coarse TDC 1000 receives two input signals, namely, a stop signal SS and a stop signal SP, converts and outputs the time difference between the start signal SS and the stop signal SP, for example, the time difference between rising edges, into digital bits Q1 to Qn.

Referring to FIG. 1, the coarse TDC 1000 includes a plurality of delay cells 1110 to 11$n$0 and a plurality of bit detectors 1210 to 12$n$0. For example, a corresponding bit detector is connected to the output of each of the delay cells 1110 to 11$n$0.

The delay cells 1110 to 11$n$0 are connected in series and output a signal to be input next delay cell after delaying it for a certain time. For example, each of the plurality of delay cells 1110 to 11$n$0 may have a delay time of sixty pico seconds (hereinafter, referred to as "60 p") as shown in FIG. 1.

A first delay cell 1110 receives the start signal SS and delays the start signal SS by 60 p to output a first delayed start signal SS_1. Likewise, a second delay cell 1120 connected to the first delay cell 1110, receives the first delayed start signal SS_1 and delays the first delayed signal SS_1 by 60 p to output a second delayed start signal SS_2 60 p.

Each of the plurality of bit detectors 1210 to 12$n$0 receives a delayed start signal and a stop signal SP. Each of the plurality of bit detectors 1210 to 12$n$0 determines an output bit according to the logic levels of the received delayed start signal and the received stop signal. For example, a first bit detector 1210 receives the first delayed start signal SS_1 and the stop signal SP, and determines a first output bit Q1 according to the logic levels of the first delayed start signal SS_1 and the stop signal. Likewise, a second bit detector 1220 receives a second delayed start signal SS_2 and the stop signal SP, and determines a second output bit Q2 according to the logic levels of the second delayed start signal SS_2 and the stop signal SP.

An encoder 10 receives output bits Q1 to Q1 from the bit detectors 1210 to 12$n$0 of the coarse TDC 1000. The encoder 10 outputs the coarse time $\Delta$ t_crs between the start signal SS and the stop signal SP according to the values of the output bits Q1 to Qn.

Figure 2:
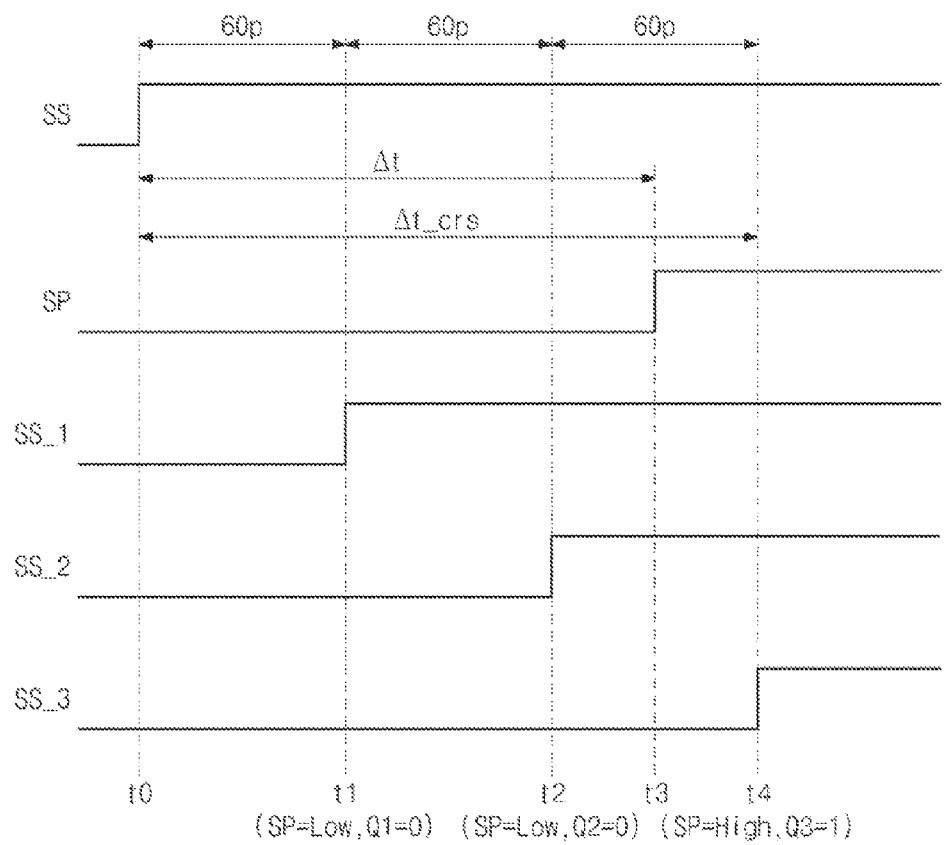
FIG. 2 depicts the operation of a coarse TDC.

FIG. 2 depicts the operation of the coarse TDC 1000 of FIG. 1. The coarse TDC 1000 measures the time difference between the rising edge of the start signal SS and the rising edge of the stop signal SP. It is assumed that the start signal SS transits from logic low to logic high at a zeroth time t0 and the stop signal transits from logic low to logic high at a certain time after the start signal SS is transited from logic low to logic high, for example, at a third time t3.

Referring to FIGS. 1 and 2, the rising edge of the start signal SS is 60 p delayed by the first delay cell 1110. Thus, the first bit detector 1210 receives the rising edge of the first delayed start signal SS_1 at a first time t1.

In this case, the first bit detector 1210 determines the logic level of the stop signal SP at the rising edge of the first delayed start signal SS_1. In FIG. 2, it is assumed that the stop signal SP has a logic low level at the first time t1, for example. In this case, the first bit detector 1210 outputs '0' as the first output bit Q1, for example.

Likewise, the first delayed start signal SS_1 is 60 p delayed by the second delay cell 1120. Thus, the second bit detector 1220 receives the second delayed start signal SS_2 that is transited from logic low to logic high at the second time t2. Since the logic level of the stop signal SP at the second time t2 is logic low, the second bit detector 1220 outputs '0' as the second output bit Q2.

The second delayed start signal SS_2 is 60 p delayed by a third delay cell 1130 and a third bit detector 1230 receives a third delayed start signal SS_3 that is transited from logic low to logic high at a fourth time t4. In this case, since the stop signal SP is transited from logic low to logic high at the third time t3, the logic level of the stop signal SP at the fourth time t4 is logic high. Thus, the third bit detector 1230 outputs, for example, '1' as a third output bit Q3.

On the other hand, the first to third output bits Q1 to Q3 are provided to the encoder 10 which outputs the coarse time Δ t_crs by using the values of the first to third output bits Q1 to Q3. For example, in FIGS. 1 and 2, the start signal SS is delayed in time unit of 60 p, and the first to third output bits Q1 to Q3 have a value of '001'. Thus, the encoder 10 outputs the coarse time t_crs, 60 p+60 p+60 p=180 p. For example, when the output bit received by the encoder 10 is '00001', the encoder 10 will output a coarse time of 60 p×5=300 p.

As described above, the coarse TDC 1000 described in FIGS. 1 and 2 may be used for measuring the time difference between the rising edge of the start signal SS and the rising edge of the stop signal SP. In this case, since the coarse TDC 1000 delays the start signal SS, for example, in time unit of 60 p, it measures the time difference in time unit of 60 p, so the coarse TDC 1000 may have an error of up to 60 p.

That is, as shown in FIG. 2, the actual time difference between the rising edge of the start signal SS and the rising edge of the stop signal SP is 'Δ t', but if the coarse TDC 1000 is used, the time difference between the rising edge of the start signal SS and the rising edge of the stop signal may be measured as 'Δ t_crs' longer than the actual 't'.

In FIGS. 3 to 6, a TDC according to another embodiment that enables precise time measurement will be described.

Figure 3:
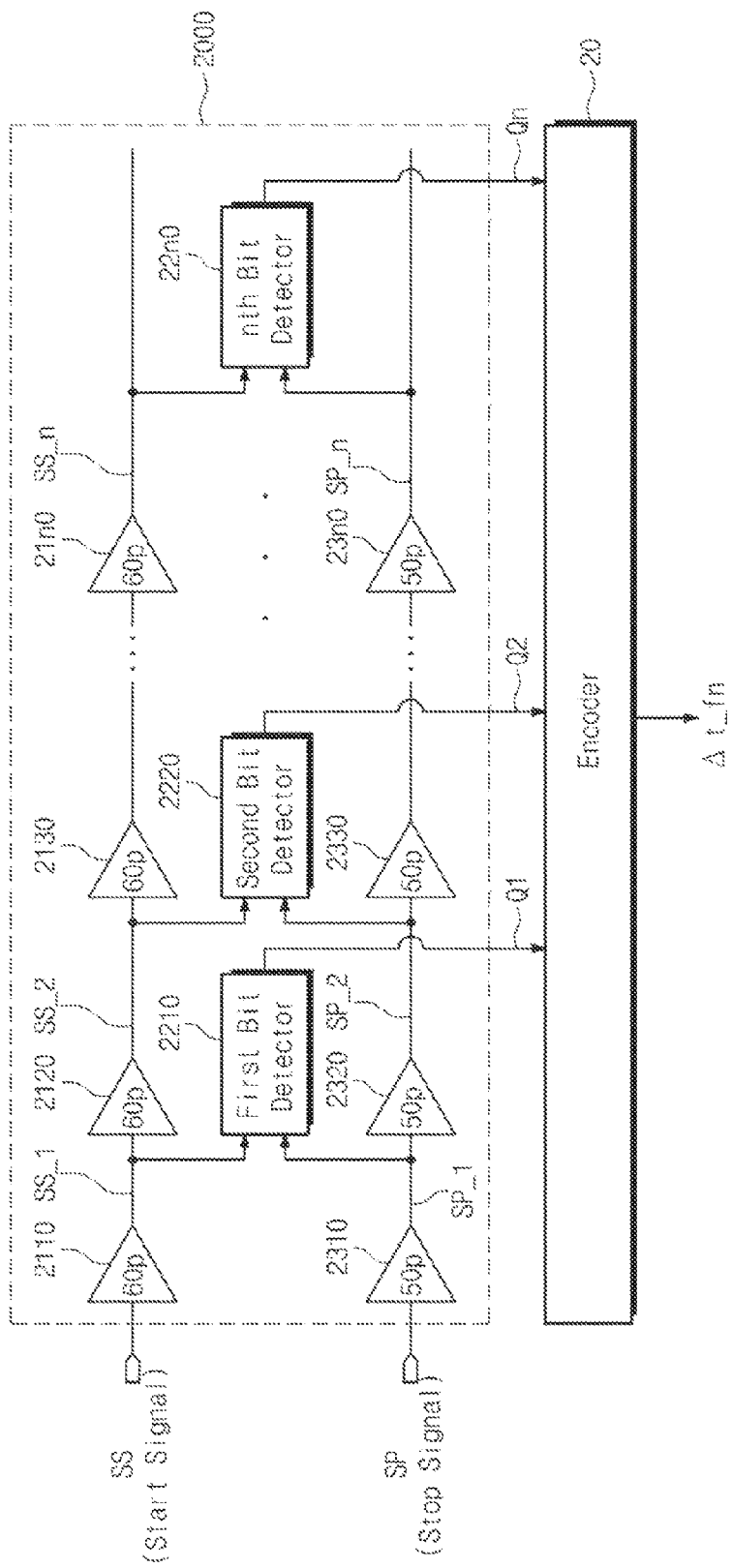
FIG. 3 shows a TDC 200 according to a second embodiment of the present invention and a time measurement device having the same.

FIG. 3 shows a TDC 200 according to a second embodiment of the present invention and a time measurement device having the same. In FIG. 3, the time measurement device includes the TDC 2000 and an encoder 20. The TDC 2000 of FIG. 3 is hereinafter referred to as 'a fine TDC'. The fine TDC 2000 delays the start signal SS and the stop signal by different time periods and thus precisely measures the time difference between the rising edge of the start signal SS and the rising edge of the stop signal SP. That is, it measures the time difference in time unit of a delay time difference between the different time periods. It is assumed below that the start signal SS and the stop signal SP are delayed by time unit of 60 p and 50 p respectively.

Referring to FIG. 3, the fine TDC 2000 includes a plurality of delay cells 2110 to 21n0 forming a first delay line, a plurality of delay cells 2310 to 23n0 forming a second delay line, and a plurality of bit detectors 2210 to 22n0.

Each of the delay cells 2110 to 21n0 forming the first delay line receives an input signal and outputs the received input signal after delaying it for a certain time. For example, as shown in FIG. 3, each of the delay cells 2110 to 21n0 forming the first delay line may have a delay time of '60 p'. In this case, the delay cells 2110 to 21n0 forming the first delay line may output the start signal SS after delaying it in time unit of 60 p. The delay cells 2310 to 23n0 forming the second delay line have a delay time different from the delay cells 2110 to 21n0 forming the first delay line. For example, as shown in FIG. 3, the delay cells 2310 to 23n0 forming the second delay line may have a delay time of '50 p', unlike the delay cells 2110 to 21n0 forming the first delay line. In this case, the delay cells 2310 to 23n0 forming the second delay line may output the stop signal after delaying it in time unit of 50 p.

Each of the plurality of bit detectors 2210 and 22n0 receives a delayed start signal and a delayed stop signal that are delayed at different time intervals. Each of the plurality of bit detectors 2210 to 22n0 determines an output bit according to the logic levels of the received delayed start signal and the received delayed stop signal. For example, the first bit detector 2210 receives the first delayed start signal SS_1 and a first delayed stop signal SP_1, and determines the first output bit Q1 according to the logic levels of the first delayed start signal SS_1 and the first delayed stop signal SP_1. Likewise, the second bit detector 2220 receives the second delayed start signal SS_2 and a second delayed stop signal SP_2, and determines the second output bit Q2 according to the logic levels of the second delayed start signal SS_2 and the second delayed stop signal SP_2.

The encoder 20 receives the output bits Q1 to Qn from the bit detectors 2210 to 22n0 of the fine TDC 2000. The encoder 20 outputs the fine time Δ t_fn between the start signal SS and the stop signal SP according to the values of the output bits Q1 to Qn.

Figure 4:
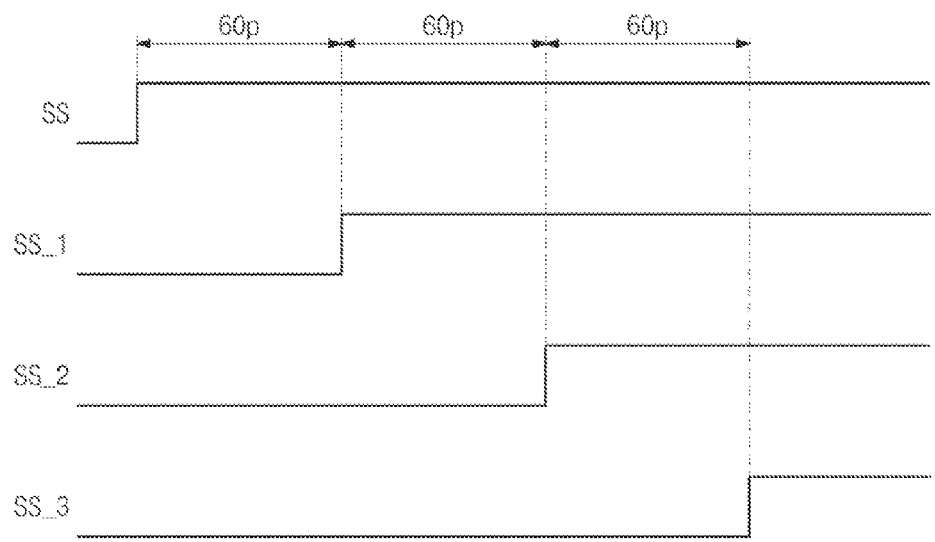
FIGS. 4 and 5 exemplarily show a start signal and a stop signal respectively that are delayed by the fine TDC of FIG. 3.
Figure 5:
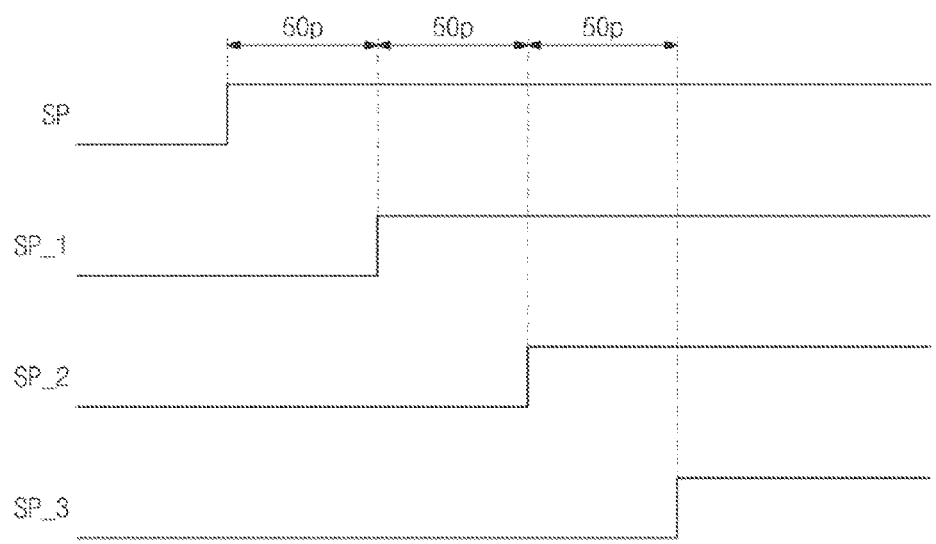

FIGS. 4 and 5 exemplarily show a start signal and a stop signal respectively that are delayed by the fine TDC 2000 of FIG. 3;

Referring to FIGS. 3 and 4, the start signal SS is delayed in time unit of 60 p by the delay cells 2110 to 21n0 forming the first delay line. Specifically, the start signal SS is provided to the delay cell 2110 which outputs the first delayed start signal SS_1 60 p delayed than the start signal SS. Likewise, the first delayed start signal SS_1 is provided to the delay cell 2120 which outputs the second delayed start signal SS_2 60 p delayed than the first delayed start signal SS_1.

Moreover, referring to FIGS. 3 and 5, the stop signal SP is delayed in time unit of 50 p by the delay cells 2310 to 23n0 forming the second delay line. Specifically, the stop signal SP is provided to the delay cell 2310 which outputs the first delayed stop signal SP_1 50 p delayed than the stop signal SP. Likewise, the first delayed stop signal SP_1 is provided to the delay cell 2320 which outputs the second delayed stop signal SP_2 50 p delayed than the first delayed stop signal SP_1.

As shown in FIGS. 4 and 5, the fine TDC 2000 of FIG. 3 delays the start signal SS and the stop signal SP in time unit of 60 p and 50 p respectively through the first and second delay lines. The fine TDC 2000 of FIG. 3 may be used for measuring the time difference between the rising edge of the start signal SS and the rising edge of the stop signal SP in time unit (that is, in time unit of 10 p) corresponding to the delay time difference between the first delay line (60 p) and the second delay line (50 p). This will be described below in more detail with reference to FIG. 6.

Figure 6:
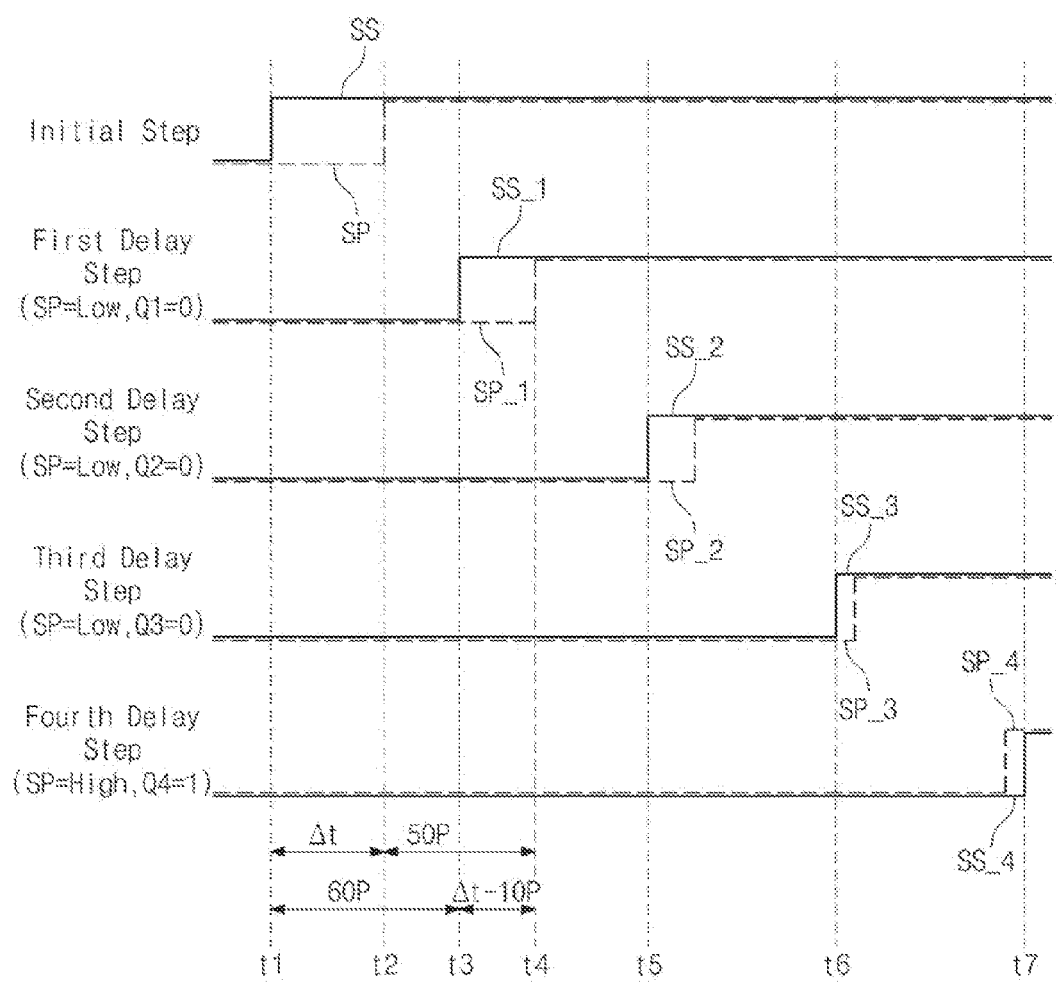
FIG. 6 depicts the exemplary operation of the fine TDC of FIG. 3.

FIG. 6 depicts the exemplary operation of the fine TDC 2000 of FIG. 3. In FIG. 6, solid lines represent the start signal SS and delayed start signals and broken lines represent the stop signal SP and delayed stop signals. In FIG. 6, it is assumed that the rising edge of a fourth delayed stop signal SP_4 leads the rising edge of a fourth delayed start signal SS_4. The operation of the fine TDC 2000 of FIG. 3 will be described below in detail with reference to FIGS. 3 to 6.

In the initial step, there is a time difference 'Δt' between the rising edge of the start signal SS and the rising edge of the stop signal SP. That is, the start signal SS is transited from logic low to logic high at the first time t1 and the stop signal SP is transited from logic low to logic high at the second time t2.

Subsequently, in a first delay step, the start signal SS is 60 p delayed by the delay cell 2110 and the stop signal SP is 50 p delayed by the delay cell 2310. That is, the rising edge of the first delayed start signal SS_1 is located at the third time t3 60 p delayed than the first time t1, and the rising edge of the second delayed stop signal SP_1 is located at the fourth time t4 50 p delayed than the second time t2.

In this case, the time difference between the rising edge of the first delayed start signal SS_1 and the rising edge of the first delayed stop signal SP_1 decreases by '10 p' as compared to the time difference between the rising edge of the start signal SS and the rising edge of the stop signal SP. That is, as shown in FIG. 6, the time difference between the rising edge of the first delayed start signal SS_1 and the rising edge of the first delayed stop signal SP_1 decreases to 'Δt−10 p'.

In this case, the first bit detector 2210 receives the first delayed start signal SS_1 and the first delayed stop signal SP_1 and determines the logic level of the first delayed stop signal SP_1 at the rising edge of the first delayed start signal SS_1. In FIG. 6, at the rising edge of the first delayed start signal SS_1 (that is, at the third time t3), the first delayed stop signal SP_1 has a logic low level, for example. Thus, the first bit detector 2210 outputs '0' as the first output bit Q1, for example.

Subsequently, in a second delay step, the first delayed start signal SS_1 is 60 p delayed by the delay cell 2120 and the first delayed stop signal SP_1 is 50 p delayed by the delay cell 2320. That is, the time difference between the rising edge of the second delayed start signal SS_2 and the rising edge of the second delayed stop signal SP_2 decreases by '10 p' as compared to the time difference between the rising edge of the first delayed start signal SS_1 and the rising edge of the first delayed stop signal SP_1. In this case, since the second delayed stop signal SP_2 is logic low at the rising edge of the second delayed start signal SS_2 (that is, at a fifth time t5), the second bit detector 2220 outputs '0' as the second output bit Q2.

Likewise, in a third delay step, since the third delayed stop signal SP_3 is logic low at the rising edge of the third delayed start signal SS_3 (that is, at a sixth time t6), the third bit detector 2230 outputs '0' as the third output bit Q3.

In a fourth delay step, the third delayed start signal SS_3 is 60 p delayed by the delay cell 2140 and the third delayed stop signal SP_3 is 50 p delayed by the delay cell 2340. In this case, the rising edge of the fourth delayed stop signal SP_4 leads the rising edge of the fourth delayed start signal SS_4. That is, the fourth delayed stop signal SP has a logic high level at the rising edge of the fourth delayed start signal SS_4 (that is, at a seventh time t7). In this case, the fourth bit detector 2240 outputs '1' as the fourth output bit Q4, for example.

Continuing to refer to FIGS. 3 and 6, the first to fourth output bits Q1 to Q4 are provided to the encoder 20 which outputs a fine time Δ t_fn by using the values of the first to fourth output bits Q1 to Q4. For example, in FIGS. 3 and 6, the time difference between the rising edge of the start signal SS and the rising edge of the stop signal is measured in time unit of 10 p and the first to fourth output bits Q1 to Q4 have a value of '0001'. Thus, the encoder 20 outputs the fine time Δ t_fn, 10 p+10 p+10 p+10 p=40 p.

As described with reference to FIGS. 3 to 6, the time measurement device including the fine TDC 2000 may precisely measure the time between the start signal SS and the stop signal SP as compared to the coarse TDC 1000. However, since time information is precisely converted into digital bits, the fine TDC 2000 has a longer conversion time than the coarse TDC 1000 (see FIG. 1). A TDC according to another embodiment of the present invention will be described below, which is obtained by combining the coarse TDC 1000 with the fine TDC 2000 and ensures both a high operating speed and high precision.

Figure 7:
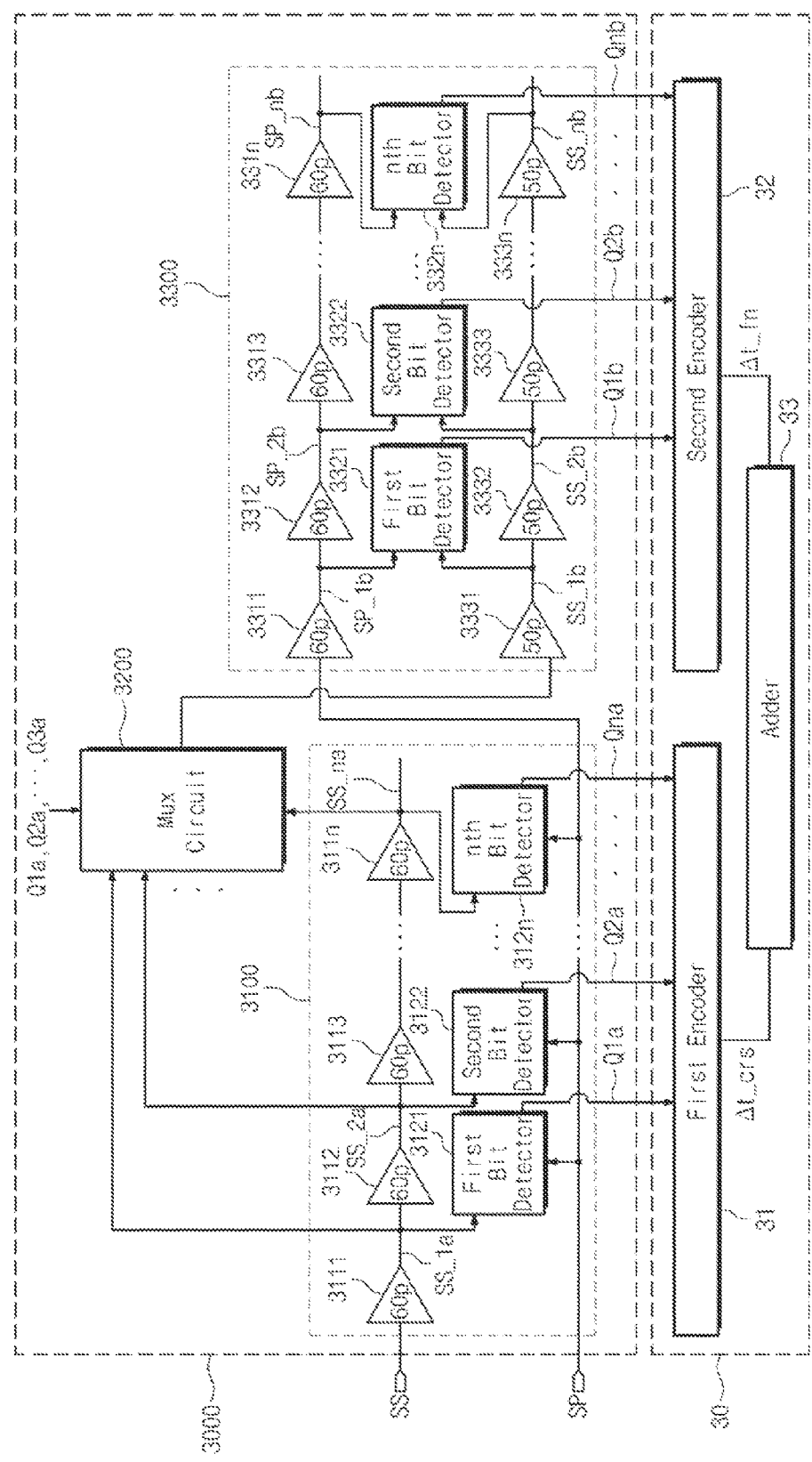
FIG. 7 shows a TDC 300 according to a third embodiment of the present invention and a time measurement device having the same.

FIG. 7 shows a TDC 300 according to a third embodiment of the present invention and a time measurement device having the same. In FIG. 7, the time measurement includes the TDC 3000 and an encoder 30. The TDC 3000 of FIG. 7 is referred to as a '2 step TDC'. It is assumed below that the delay cells of the coarse TDC have a delay time of 60 p and the delay cells of the fine TDC have a delay time of 60 p or 50 p.

Referring to FIG. 7, the 2 step TDC 3000 includes a coarse TDC 3100, a fine TDC 3300, and a multiplexer (mux) circuit 3200.

The coarse TDC 3100 includes a plurality of delay cells 3111 to 311n and a plurality of bit detectors 3121 to 312n. The plurality of delay cells 3111 to 311n delay the start signal SS in time unit of 60 p and the plurality of bit detectors 3121 to 312n determine the values of output bits Q1a to Qna according to the logic level of the first delayed start signal and the stop signal SP. The configuration and operation of the coarse TDC 3100 is similar to the coarse TDC 1000 of FIG. 1, so related detailed descriptions are skipped.

The mux circuit 3200 receives first delayed start signals SS_1a to SS_na and output bits Q1a to Qna of the coarse TDC 3100. The mux circuit 3200 provides any one of the first delayed start signals SS_1a to SS_na to a second delay line (that is, a 50 p unit delay line) of the fine TDC 3300 according to the values of the output bits Q1a to Qna. For example, if the output bit Qna of the coarse TDC 3100 is '1', the mux circuit 3200 provides a delayed start signal SS_na corresponding to an output bit Qna to the second delay line of the fine TDC 3300.

The fine TDC 3300 includes a plurality of delay cells 3311 to 331n forming the first delay line, a plurality of delay cells 3331 to 333n forming the second delay line, and a plurality of bit detectors 3321 to 332n.

The plurality of delay cells 3311 to 331n forming the first delay line delays the stop signal SP in time unit of 60 p and outputs delayed stop signals SP_1b to SP_nb. The plurality of delay cells 3331 to 333n forming the second delay line delays a signal received from the mux signal 3200 in time unit of 50 p and outputs second delayed start signals SS_1b to SS_nb. Each of the plurality of bit detectors 3321 to 332n determines the values of output bits Q1b to Qnb according to the logic levels of the delayed stop signals SP_1b to SP_nb and the second delayed start signals SS_1b to SS_nb.

The configuration and operation of the fine TDC 3300 are similar to those of the fine TDC 2000 of FIGS. 3 to 6 except that the stop signal is provided to the first delay line (that is, a 60 p unit delay line) and a signal is provided from the mux circuit 3200 to the second delay line (that is, a 50 p unit delay line). Thus, related detailed descriptions are skipped.

Continuing to refer to FIG. 7, the encoder 30 includes a first encoder 31, a second encoder 32, and an adder 33.

The first encoder 31 receives the output bits Q1a to Qna from the coarse TDC 3100 and outputs a coarse time Δ t_crs. The second encoder 32 receives the Q1b to Qnb from the fine TDC 3300 and outputs a fine time Δ t_fn. The adder 33 subtracts the fine time Δ t_fn from the coarse time Δ t_crs and outputs the time difference Δ t between the start signal SS and the stop signal SP.

Figure 8:
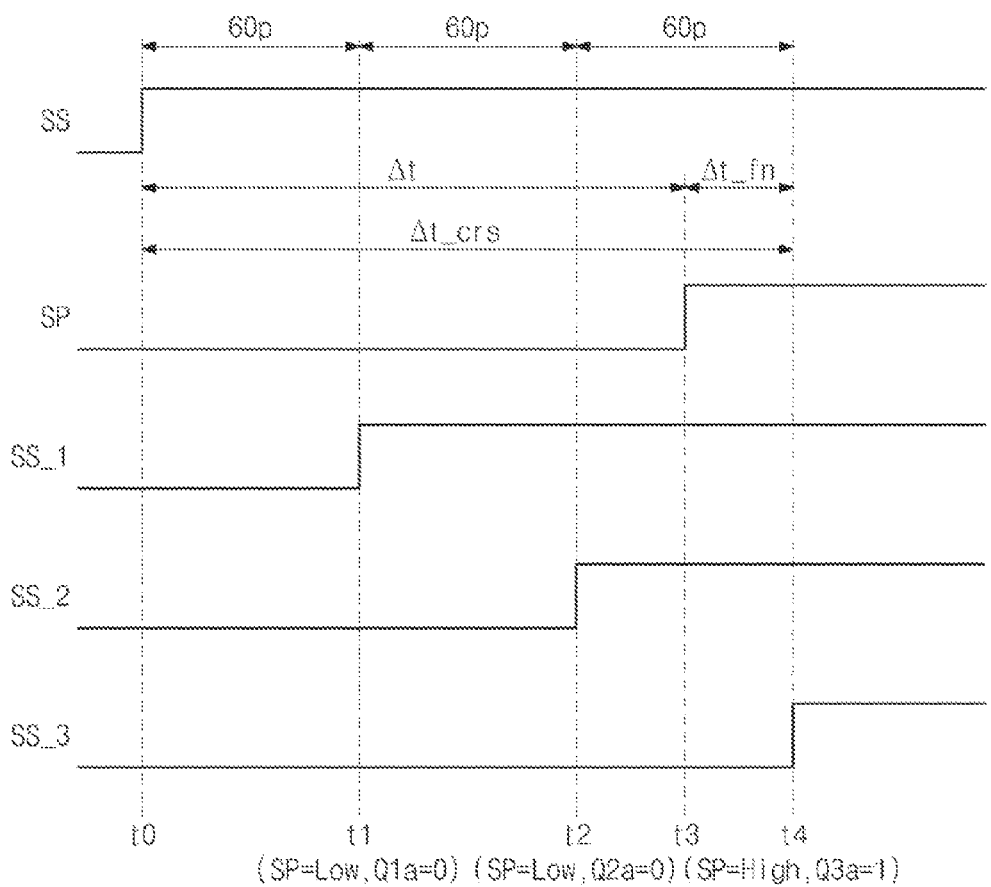
FIG. 8 depicts in more detail the operation of a 2 step TDC 3000 of FIG. 7.

FIG. 8 depicts in more detail the operation of the 2 step TDC 3000 of FIG. 7. At the third time t3, it is assumed that the stop signal SP is transited from logic low to logic high. The 2 step TDC 3000 measures the time difference between the initial time t0 and the fourth time t4 in time unit of 60 p and the time difference between the third time t3 and the fourth time t4 in time unit of 10 p. Thus, it may ensure a high operating speed and high accuracy.

Referring to FIGS. 7 and 8, the coarse TDC 3100 of the 2 step TDC 3000 measures the time difference between the start signal SS and the stop signal in time unit of 60 p and the first encoder 31 outputs the coarse time Δ t_crs.

Specifically, the rising edge of the start signal SS is delayed in time unit of 60 p by the delay cells 3111 to 311n of the coarse TDC 3100. Thus, at the first, second and fourth times t1, t2 and t4, the first delayed start signals SS_1a, SS_2a and SS_3a are delayed by 60 p, 120 p and 180 p as compared to the start signal SS.

In this case, since the stop signal SP is transited from logic low to logic high at the third time t3 (between the second time t2 and the fourth time t4), the stop signal SP has a logic low level at the first and second times t1 and t2. Thus, the first and second bit detectors 3121 and 3122 of the coarse TDC 3100 outputs '0' as the output bits Q1a and Q2a.

Moreover, since the stop signal SP is transited from logic low to logic high at the third time t3, the stop signal SP has a logic high level at the fourth time t4. Thus, the third bit detectors 3123 of the coarse TDC 3100 outputs '1' as the output bit Q3a. Thus, an output bit of '001' is delivered to the first encoder 31 which then outputs '180 p' as the coarse time Δ t_crs.

On the other hand, if the output bit Q3a at the rising edge of a third first delayed start signal SS_3a (that is, at the fourth time t4) is '1', the mux circuit 3200 provides the third first delayed start signal SS_3a to the second delay line of the fine TDC 3300 (that is, a delay line having a delay time of 50 p) in response to the output bit Q3a.

In this case, continuing to refer to FIGS. 7 and 8, the fine TDC 3300 measures the time difference between the rising edge of the stop signal SP and the rising edge of the third first delayed start signal SS_3a in time unit of 10 p and the second encoder 32 outputs the fine time Δ t_fn.

Specifically, the stop signal SP is provided to the first delay line of the fine TDC 3300 (that is, a delay line having a delay time of 60 p) and the third first delayed start signal SS_3a is provided to the second delay line of the fine TDC 3300 (that is, a delay line having a delay time of 50 p). Thus, the fine TDC 3311 decreases and measures the time difference between the stop signal SP and the third first start signal SS_3a to time unit of 10 p step by step.

The second encoder 32 receives the output bits Q1b to Qnb of the fine TDC 3300 and outputs the fine time Δ t_fn. The operations of the fine TDC 3300 and the second encoder 32 are similar to those of the fine TDC 2000 (see FIG. 2) and the encoder 20 that are described in FIGS. 2 to 6, so related detailed descriptions are skipped.

On the other hand, the adder 33 subtracts the fine time Δt_fn from the coarse time Δ t_crs and may thus measure the time difference Δt between the start signal SS and the stop signal SP.

As described with reference to FIGS. 7 and 8, the 2 step TDC 3000 according to an embodiment of the present invention measures the coarse time Δ t_crs in long time unit (for example, in time unit of 60 p) by using the coarse TDC 3100 and measures the fine time Δ t_fn in short time unit (for example, in time unit of 10 p) by using the fine TDC 3300. Thus, it may quickly and accurately measure the time difference between the start signal SS and the stop signal SP.

However, in implementing the 2 step TDC 2000 of FIG. 2, an unexpected delay may take place in addition to delays on the coarse TDC 3100 and the fine TDC 3300. For example, such an unexpected delay may be caused in the process of implementing the mux circuit 3200 for connecting the coarse TDC 3100 to the fine TDC 3300. As another example, such an unexpected delay may take place because the error of the coarse TDC 3100 affects the fine TDC 3300.

Such an unexpected delay is hereinafter referred to as a 'mux delay'. More particularly, the stop signal and the second delayed start signal that are signals input to the fine TDC are respectively input to the first delay line and the second delay line of the fine TDC. In this case, the stop signal needs to lead the second delayed start signal and if the second delayed start signal leads the stop signal, the error previously referred to as the mux delay takes place. Such a mux delay deteriorates the linearity of the 2 step TDC 3000 described with respect to FIG. 7 and may thus cause decrease in reliability of the 2 step TDC 3000. FIGS. 9 to 13 will describe in more detail with respect to deterioration in linearity that the 2 step TDC 3000 of FIG. 7 suffers due to the mux delay. FIGS. 14 to 17 will describe in detail with respect to a 2 step TDC according to another embodiment of the present invention that ensures linearity irrespective of the mux delay.

Figure 9:
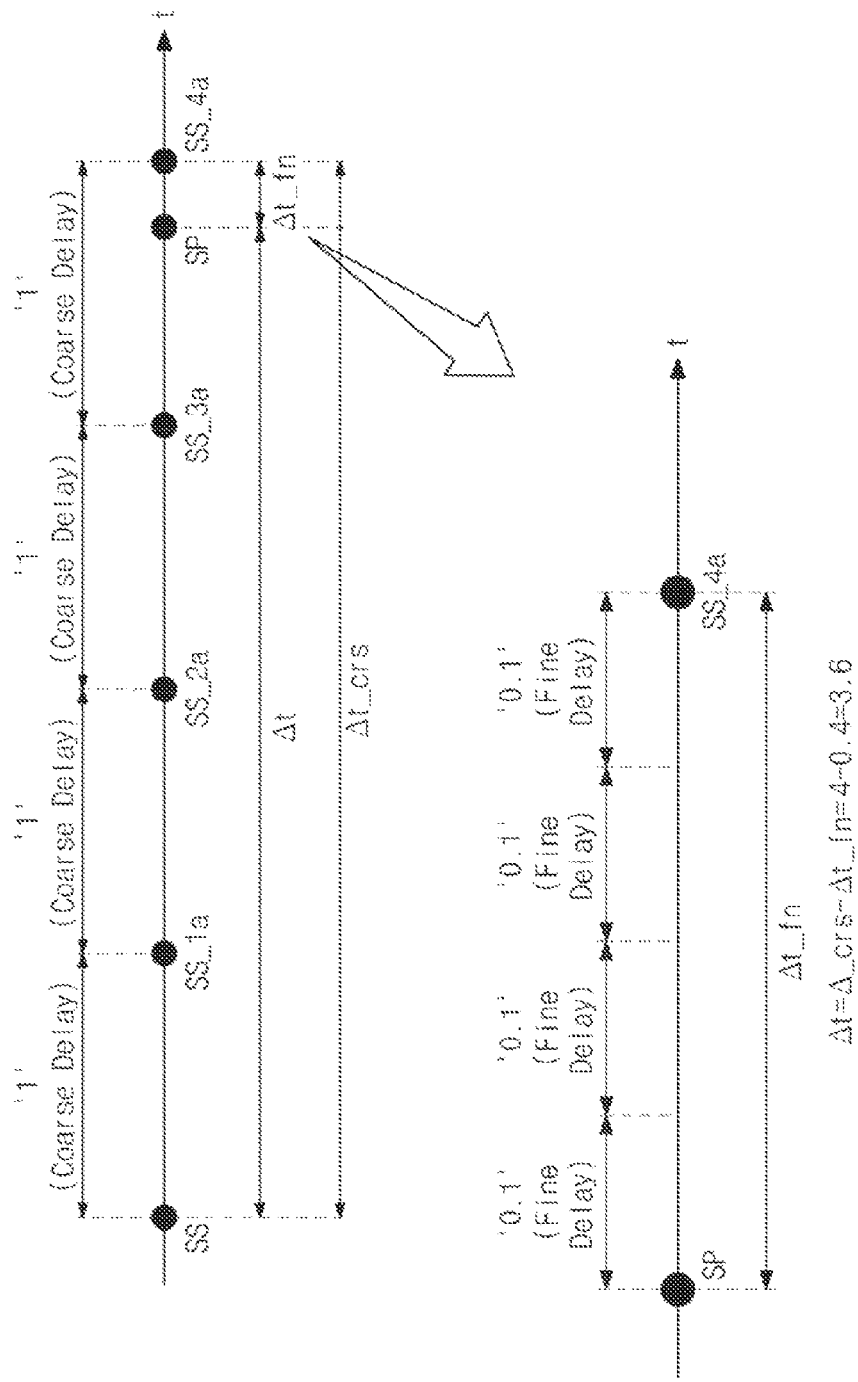
FIG. 9 simply depicts the operation of the 2 step TDC 3000 of FIG. 7 when there is no multiplexer (mux) delay.

FIG. 9 simply depicts the operation of the 2 step TDC 3000 of FIG. 7 when there is no mux delay. It is assumed that a unit of measurement of the coarse TDC 3100 is '1' and it is assumed that a unit of measurement of the fine TDC 3300 is '0.1'.

Referring to FIGS. 7 and 9, the coarse time Δ t_crs is measured as, for example, '4' by the coarse TDC 3100 and the first encoder 31. Moreover, the fine time Δ t_fn is measured as, for example, '0.4' by the fine TDC 3300 and the second encoder 32. Since there is no mux delay, the time difference between the start signal SS and the stop signal SP is measured as '3.6' that is obtained by subtracting the fine time Δ t_fn from the coarse time Δ t_crs.

Figure 10:
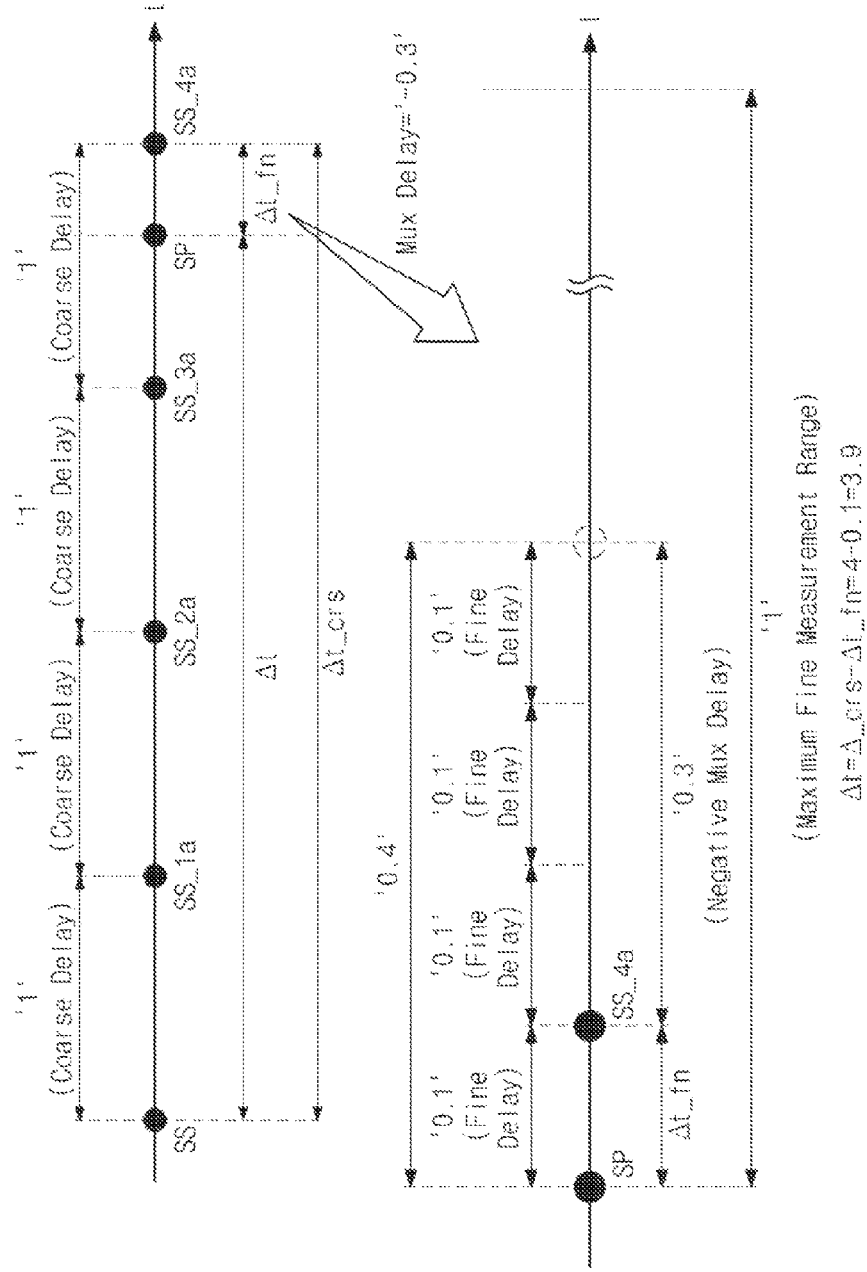
FIGS. 10 and 11 simply depict the operation of the 2 step TDC 3000 of FIG. 7 when there is a mux delay.
Figure 11:
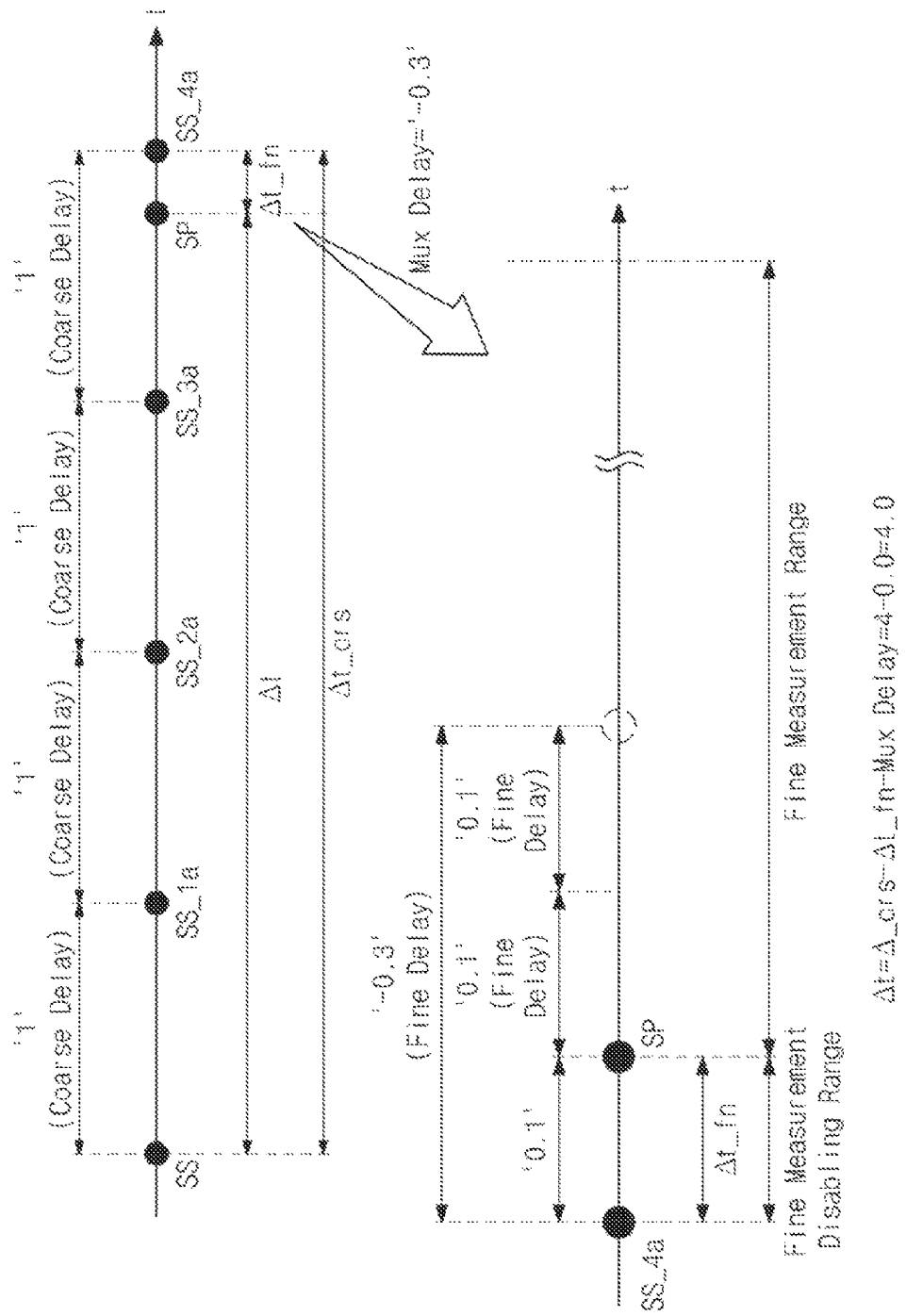

FIGS. 10 and 11 simply depict the operation of the 2 step TDC 3000 of FIG. 7 when there is a mux delay. In FIGS. 10 and 11, it is assumed that the unit of measurement of the coarse TDC 3100 is '1' and that the unit of measurement of the fine TDC 3300 is '0.1', as in FIG. 9.

However, unlike FIG. 9, there is a mux delay and it is assumed that the value of the mux delay is '−0.3', in FIGS. 10 and 11. The mux delay has a negative value.

On the other hand, it is assumed that in an ideal case (that is, when there is no mux delay), the time difference Δ t between the start signal SS and the stop signal SP of FIG. 10 is '3.6' as in FIG. 9. It is assumed that the time difference Δ t between the start signal SS and the stop signal SP of FIG. 11 is '3.8' in an ideal case.

Referring to FIGS. 7 and 10, the coarse time Δ t_crs is measured as '4' by the coarse TDC 3100 and the first encoder 31. In this case, since the mux delay is '−0.3', the rising edge of fourth first delayed start signal SS_4a is provided to the second delay line (that is, a delay line having a delay time of 50 p) of the fine TDC 3300 at a time '−0.3' reduced as compared to FIG. 9. Thus, the fine time Δ t_fn is measured as '0.1' by the fine TDC 3300 and the second encoder 32 and the time difference Δ t between the start signal SS and the stop signal SP is measured as '3.9' that is obtained by subtracting the fine time Δ t_fn from the coarse time Δ t_crs. That is, the time difference Δ t between the start signal SS and the stop signal SP of FIG. 10 has an error of '0.3' as compared to the time difference Δ t between the start signal SS and the stop signal SP of FIG. 9 (that is, a time difference when there is no mux delay).

Referring to FIGS. 7 and 11, the coarse time Δ t_crs is measured as '4' by the coarse TDC 3100 and the first encoder 31. In this case, since the mux delay is '−0.3', the rising edge of the fourth first delayed start signal SS_4a is provided to the second delay line of the fine TDC 3300 (that is, a delay line having a delay time of 50 p) at a '−0.3' reduced time.

Since the delayed start signal SS_4a has a fine time Δ t_fn of '0.2' in an ideal case, the rising edge of the delayed start signal SS_4a leads the rising edge of the stop signal SP when there is a mux delay of '−0.3'. That is, as shown in FIG. 11, the rising edge of the delayed start signal SS_4a leads by '0.1' as compared to the rising edge of the stop signal SP.

In this case, since the delayed start signal SS_4a leads the stop signal SP, the fine TDC 3300 may not measure the time difference between the stop signal SP and the delayed start signal SS_4a. Thus, the fine TDC 3300 and the second encoder 32 outputs a value of '0' to the fine time Δ t_fn, for example. As a result, the time difference Δ t between the start signal SS and the stop signal SP is measured as '4.0' and has an error of '0.2' as compared to the time difference when there is no mux delay (that is, Δ t='3.8').

As described with reference to FIGS. 10 and 11, the mux delay may affect an linearity. That is, the mux delay is assumed to be '−0.3' equally in FIGS. 10 and 11 but FIG. 10 has an error of '−0.3' as compared to when there is no mux delay and FIG. 11 has an error of '−0.2' as compared to when there is no mux delay.

Figure 12:
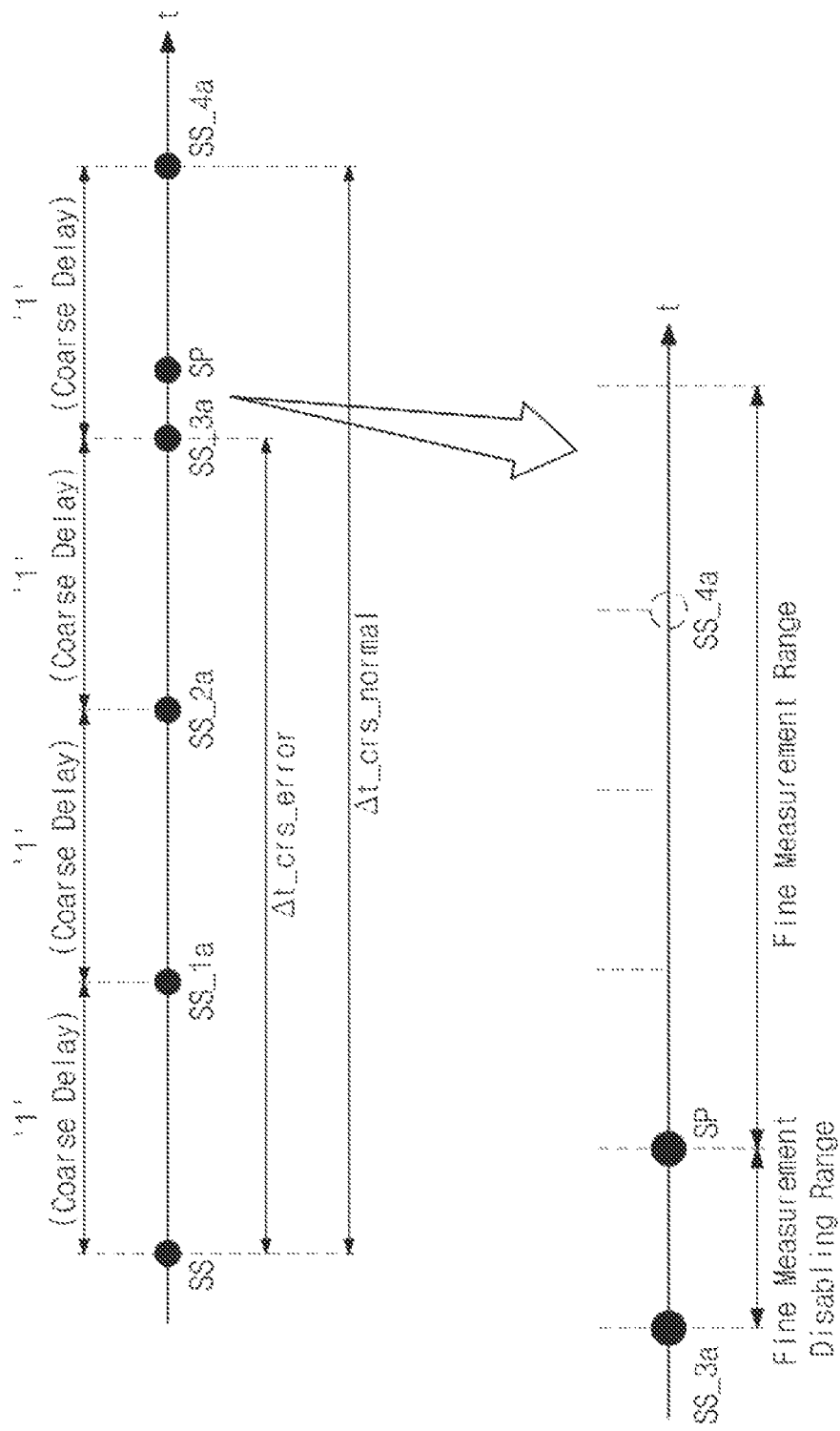
FIG. 12 exemplarily depicts a mux delay caused by the error of the coarse TDC 3100 (see FIG. 7)

Such a mux delay may be caused for various reasons. For example, the mux delay may be caused by a design fault of the mux circuit 3200 or by the error of the coarse TDC 3100. In FIG. 12, the mux delay caused by the error of the coarse TDC 3100 will be described in more detail.

FIG. 12 exemplarily depicts a mux delay caused by the error of the coarse TDC 3100 (see FIG. 7). It is assumed that the rising edge of the stop signal SP is located between the rising edge of the third first delayed start signal SS_3a and the rising edge of the fourth first delayed start signal SS_4a.

Referring to FIG. 12, since the rising edge of the stop signal SP is located between the rising edge of the third first delayed start signal SS_3a and the rising edge of the fourth first delayed start signal SS_4a, the coarse TDC 3100 and the first encoder 31 need to measure the coarse time as '4' in a normal case (that is, Δ t_crs_normal='4'). However, due to the error of the coarse TDC 3100, the coarse time may be measured as '3' as shown in FIG. 12 (that is, Δ t_crs_error='3').

In this case, the third first delayed start signal (SS_3a) provided to the second delay line of the fine TDC 3300 (that is, a delay line having a delay time of 50 p) leads the stop signal SP. This is substantially the same as the mux delay as shown in FIG. 11. That is, due to the error of the coarse TDC 3100, the mux delay as shown in FIG. 11 may take place.

Figure 13:
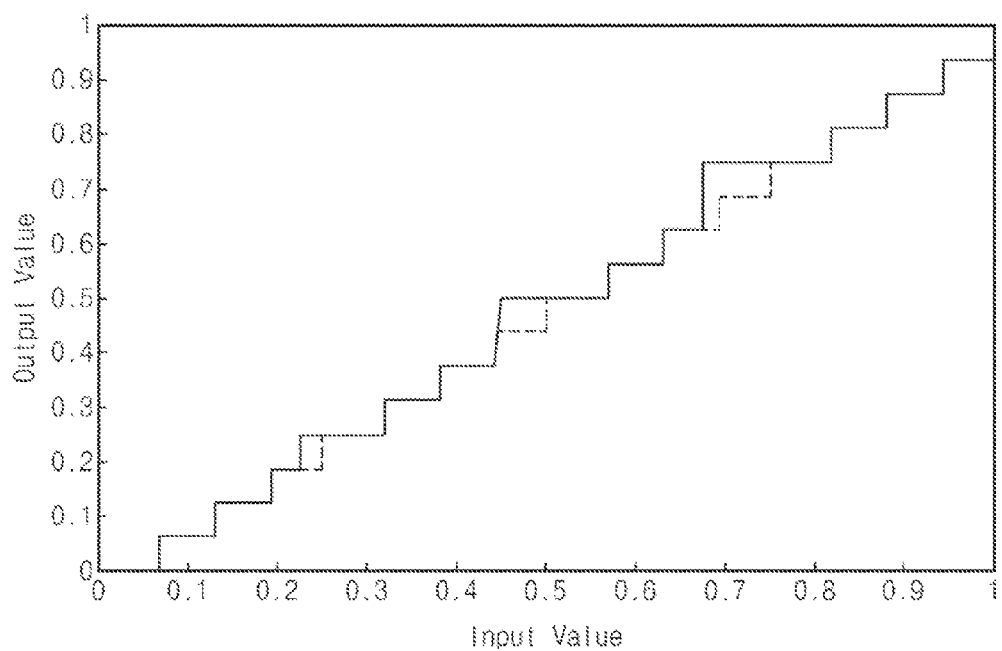
FIG. 13 shows a result of simulating a decrease in the linearity of the 2 step TDC 3000 of FIG. 7 when there is a mux delay.

FIG. 13 shows a result of simulating a decrease in the linearity of the 2 step TDC 3000 of FIG. 7 when there is a mux delay. Referring to FIG. 13, the X axis represents the time difference between the start signal SS and the stop signal SP and the Y axis represents the digital bits of the measured time Δ t as analog values.

As shown in FIG. 13, when a mux delay takes place, the 2 step TDC 3000 fails to maintain linearity. This causes decreases in reliability of the 2 step TDC 3000 and the time measurement device including the 2 step TDC 3000. In order to solve such drawbacks, a 2 step TDC according to another embodiment of the present invention will be described in detail, which ensures a high operating speed and high accuracy as in the 2 step TDC 3000 of FIG. 7 and also ensures linearity.

Figure 14:
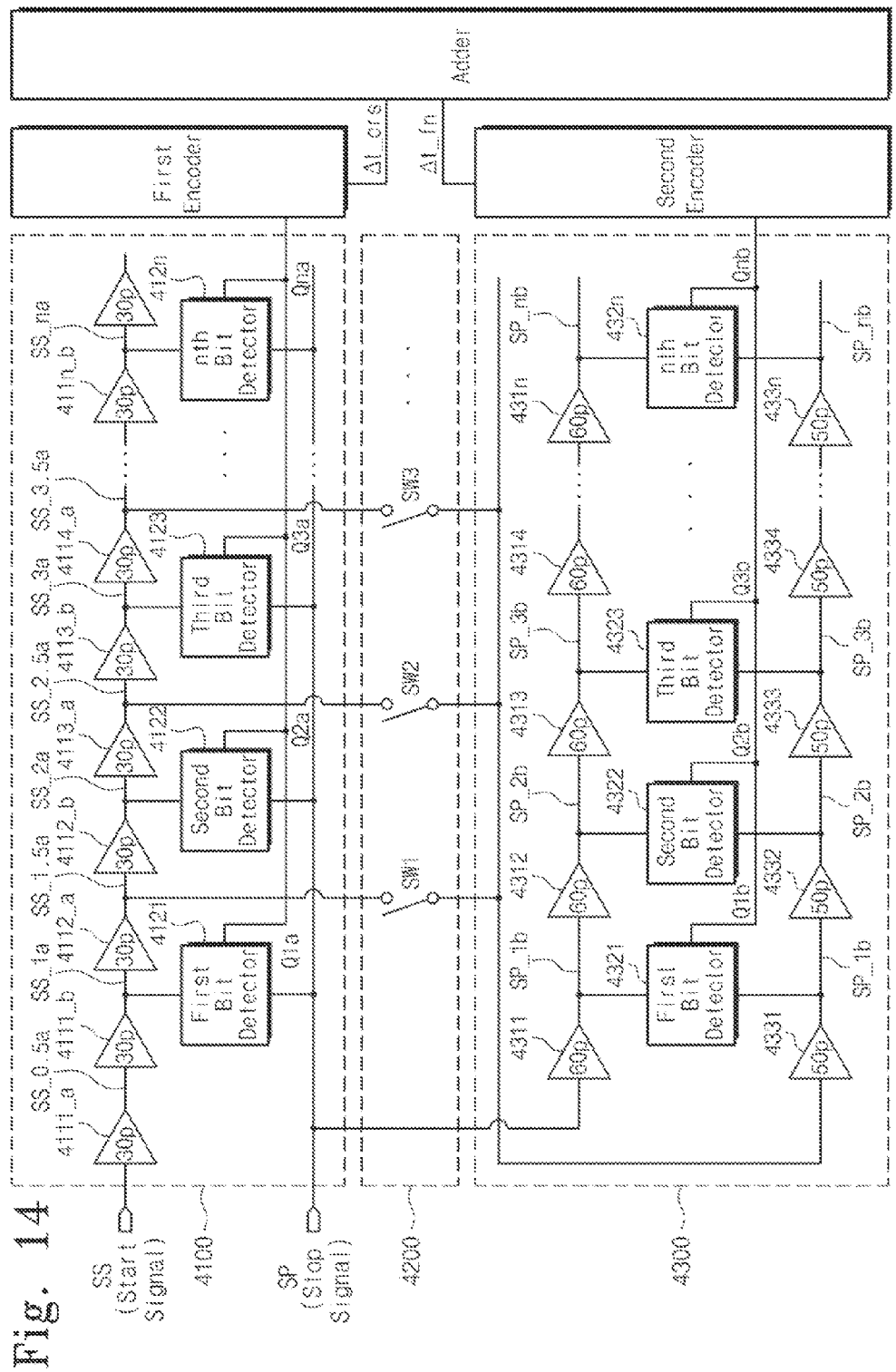
FIG. 14 shows a TDC 4000 according to a fourth embodiment of the present invention.

FIG. 14 shows a TDC 4000 according to a fourth embodiment of the present invention. The TDC 4000 of FIG. 14 is referred to as an 'extended 2 step TDC'. It is assumed that the delay cells of the coarse TDC have a delay time of 30 p and the delay cells of the fine TDC have a delay time of 60 p or 50 p.

Referring to FIG. 14, the extended 2 step TDC 4000 includes a coarse TDC 4100, a mux circuit 4200, and a fine TDC 4300. The configuration and operation of the extended 2 step TDC 4000 are similar to those of the 2 step TDC 3000 of FIG. 7. Thus, the difference between the extended 2 step TDC 4000 and the 2 step TDC 3000 of FIG. 7 will be mainly described below.

The coarse TDC 4100 includes a plurality of first delay cells 4111_a to 411n_a and 4111_b to 411n_b and a plurality of bit detectors 4121 to 412n, namely, coarse bit detectors. Unlike the coarse TDC 3100 of FIG. 7, each delay cell of the coarse TDC 4100 of FIG. 14 has a delay time of 30 p. Two adjacent delays cells of the first delay cells of the coarse TDC 4100 of FIG. 14 form a pair and correspond to one delay cell of the TDC 3100 of FIG. 7.

For example, two first delay cells 4111_a and 4111_b of the coarse TDC 4100 of FIG. 14 correspond to the delay cell 3111 of FIG. 7 and 60 p delay the start signal SS. Likewise, two first delay cells 4112_a and 4112_b of the coarse TDC 4100 of FIG. 14 correspond to the delay cell 3112 of FIG. 7. The operation of the coarse TDC 4100 of FIG. 14 is similar to the coarse TDC 3100 of FIG. 7, so related detailed descriptions will be skipped below.

The mux circuit 4200 includes a plurality of switches SW1 to SWn. The switches SW1 to SWn of the mux circuit 4200 receives corresponding delayed start signals respectively and provide to the second delay line (that is, a 50 p unit delay line) of the fine TDC 4300 any one of third start signals SS_1.5a to SS_n.5a according to the value of Q1a to Qna.

The mux circuit 4200 of FIG. 14 receives delayed start signals 30p further delayed than the mux circuit 3200 of FIG. 7 and provides a selected delayed start signal to the fine TDC 4300.

Specifically, it is assumed that the value of the output bit Q1a of a first bit detector receiving the first delayed start signal SS_1a is '1', for example. In this case, the mux circuit 3200 of FIG. 7 is configured to provide the first delayed start signal SS_1a to the fine TDC 3200 of FIG. 7. In contrast, the mux circuit 4200 of FIG. 14 is configured to provide to the fine TDC 4300 the first third delayed start signal SS_1.5a that is 30 p further delayed than the first delayed start signal SS_1a. Likewise, when the value of the output bit Q2a of the second bit detector 4122 receiving a second first delayed start signal SS_2a is '1', a second switch SW2 of the mux circuit is configured to provide to the fine TDC 4300 a second third delayed start signal SS_2.5a that is 30 p further delayed than the second first delayed start signal SS_2a.

Continuing to refer to FIG. 14, the fine TDC 4300 includes a plurality of second delay cells 4311 to 431n forming a first delay line, a plurality of third delay cells 4331 to 433n forming a second delay line, and a plurality of bit detectors 4321 to 432n, namely, fine bit detectors. The configuration and operation of the fine TDC 4300 of FIG. 14 are similar to those of the fine TDC 3300 of FIG. 7 except that a 30 p further-delayed start signal is provided to the second delay line (that is, a delay line having a delay time of 50 p). Thus, related detailed descriptions will be skipped.

As described above, each of the delay cells of the coarse TDC 4100 of FIG. 14 has a delay time of 30 p and two delay cells as a unit pair delay the start signal SS in time unit of 60 p. Moreover, each of the switches SW1 to SWn of the mux circuit 4200 is connected to the intermediate node of the pair of delay cells and provides to the second delay line of the fine TDC 4300 a delayed start signal further delayed by a certain time (for example, a 30 p further-delayed start signal in the case of FIG. 14) as compared to 2 step TDC 3000 of FIG. 7.

Such a configuration of the extended 2 step TDC 4000 has an effect of extending the measurement range of the fine TDC 4300. That is, the extended 2 step TDC 4000 has a wider measurement range than the 2 step TDC 3000 of FIG. 7 and may thus ensure linearity even if a mux delay takes place. The operation of the extended 2 step TDC 4000 of the present invention will be described in more detail with reference to FIGS. 15 and 16.

Figure 15:
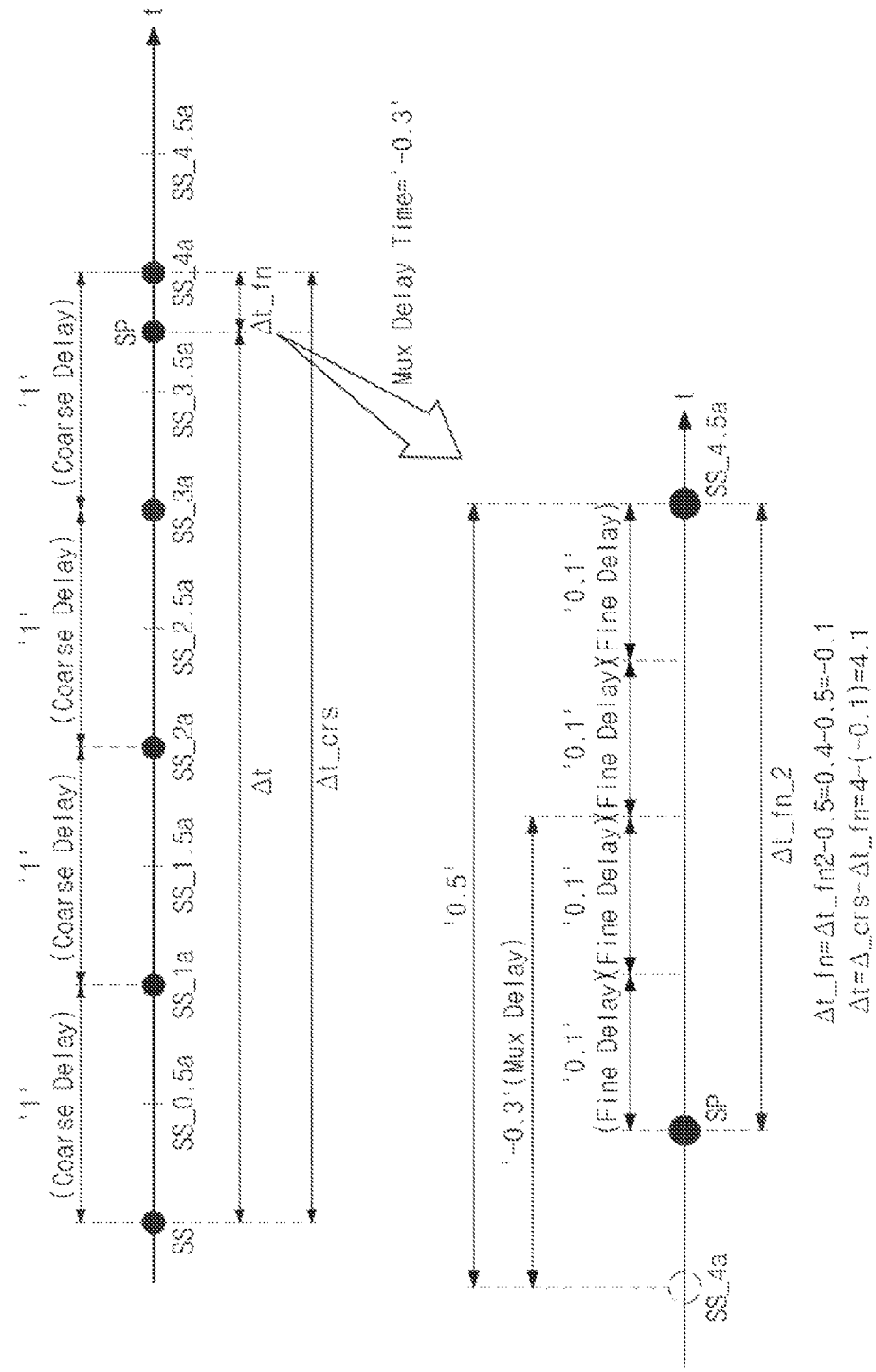
FIG. 15 depicts the operation of an extended 2 step TDC 4000 of FIG. 14.

FIG. 15 depicts the operation of the extended 2 step TDC 4000 of FIG. 14. In FIG. 15, it is assumed that the measurement unit of the coarse TDC 4100 is '1' and that the measurement unit of the fine TDC 4300 is '0.1', as in FIGS. 10 and 11. Moreover, as in FIG. 11 where linearity decreases due to a mux delay, it is assumed that the mux delay is '−0.3' and the time difference Δ t between the start signal SS and the stop signal SP is '3.8' in the case of an ideal case.

Referring to FIGS. 14 and 15, the coarse time Δ t_crs is measured as '4' by the coarse TDC 4100 of the extended 2 step TDC 4000. In this case, the mux circuit 4200 selects a fourth third delayed start signal SS_4.5a '0.5' further delayed than a fourth first delayed start signal SS_4a in order to provide it to the second delay line of the fine TDC 4300. Moreover, since the mux delay is '−0.3', the fourth third delayed start signal SS_4.5a is provided to the second delay line of the fine TDC 4300 at a '−0.3' reduced time.

As a result, the fourth third delayed start signal SS_4.5a that is '0.4' delayed than the fourth first delayed start signal SS_4a provided in the case of the ideal case is provided to the second delay line of the fine TDC 4300, as shown in FIG. 15.

In this case, the rising edge of the stop signal SP leads the rising edge of the fourth third delayed start signal SS_4.5a. This means that the fine TDC 4300 of FIG. 14 does not suffer a decrease in linearity due to the mux delay, unlike the fine TDC 3300 of FIG. 7. As a result, if the fine TDC 4300 measures '0.4' as a second fine time Δ t_fn_2 and subtracts a '0.5' delayed time from the second fine time Δ t_fn_2 (that is, Δ t_fn_2−0.5), the fine time Δ t_fn is measured as '−0.1'.

Thus, the time difference Δ t between the start time SS and the stop signal SP is measured as '4.1' (that is, Δ t_crs−Δ t_fn=4−(−0.1)=4.1). This means that the time difference Δ t between the start time SS and the stop signal SP has an error of '0.3' as compared to the time difference (that is, Δ t='3.8') when there is no mux delay. Thus, unlike the 2 step TDC 3000 of FIG. 7, the extended 2 step TDC 4000 of FIG. 14 may maintain linearity.

Figure 16:
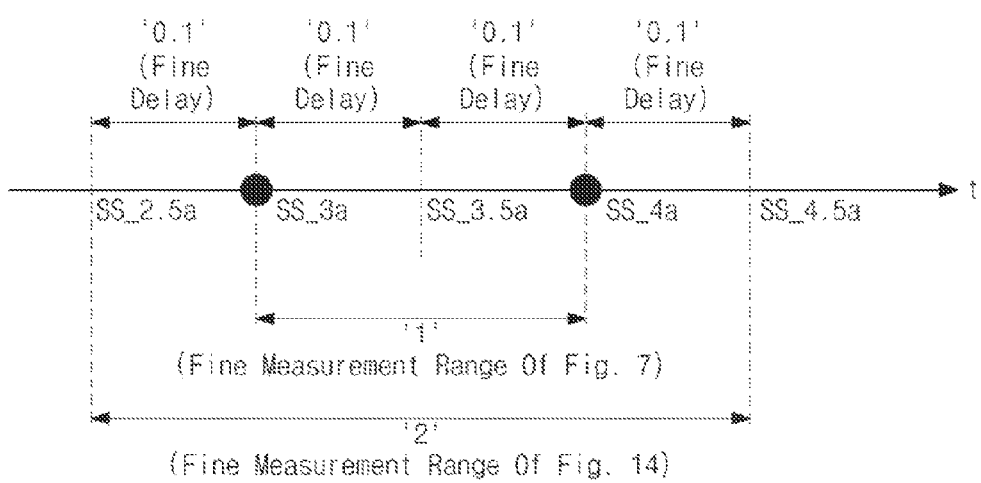
FIG. 16 simply depicts the measurement range of the fine TDC 4000 of FIG. 14.

FIG. 16 simply depicts the measurement range of the fine TDC 4000 of FIG. 14. It is assumed that each of the coarse TDC 3100 of FIG. 7 and the coarse TDC 4100 of FIG. 14 has '1' as a measurement unit'.

As shown in FIG. 16, since the coarse TDC of FIG. 7 has a coarse TDC 1 as a measurement unit, the fine TDC 3300 of FIG. 7 will be designed to have a measurement range of up to '1'. For example, if the stop signal SP is located between the third first delayed start signal SS_3a and the fourth first delayed start signal SS_4a, the fine TDC 3300 will measure the fine time Δ t_fn between '0.0 to 1.0' in time unit of '0.1'.

In contrast, the fine TDC 4300 of FIG. 4 may be designed to have a measurement range of up to '2'. For example, if the stop signal SP is located between the second third start signal SS_2.5a and the fourth third delayed start signal SS_4.5a, the fine TDC 4300 will be designed to measure the fine time Δ t_fn between '−0.5 to 1.5' in time unit of '0.1'.

As described above, the fine TDC 4300 of the extended 2 step TDC 4000 of FIG. 14 may be designed to have a measurement range two times wider than the fine TDC 3300 of the 2 step extended TDC 3000 of FIG. 7. The fine TDC 4300 of the extended 2 step TDC 4000 has a wider measurement range than the fine TDC 3300 of the 2 step TDC 3000 of FIG. 7 and may thus ensure linearity even if a mux delay takes place.

Figure 17:
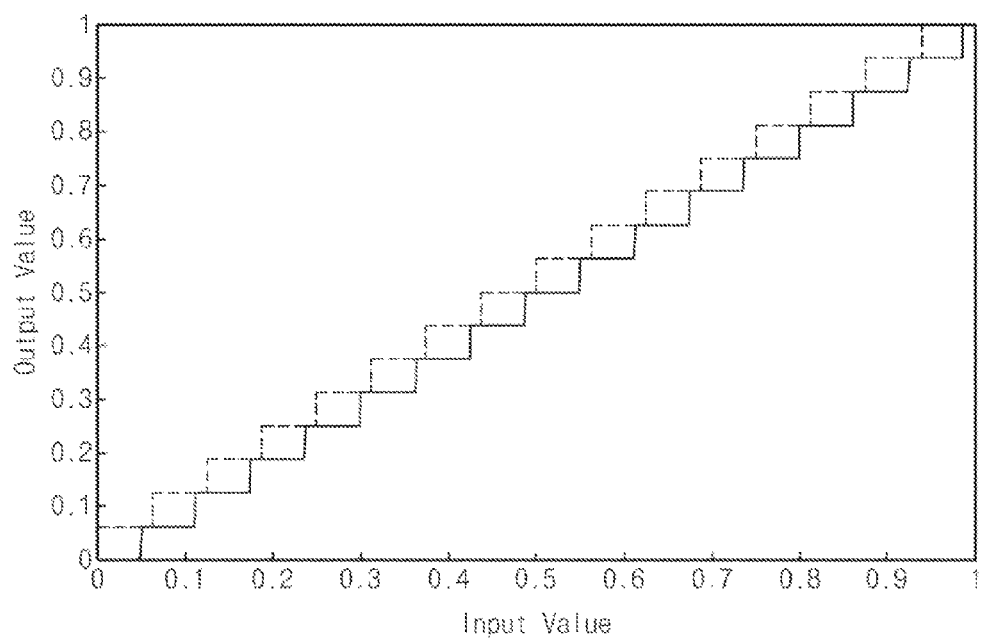
FIG. 17 is a simulation result showing that the extended 2 step TDC 4000 of FIG. 14 ensures linearity.

FIG. 17 is a simulation result showing that the extended 2 step TDC 4000 of FIG. 14 ensures linearity. Referring to FIG. 17, the X axis represents the time difference between the start signal SS and the stop signal SP and the Y axis represents the digital bit of a measured time Δ t as an analog value. As shown in FIG. 17, the extended 2 step TDC 4000 may maintain linearity irrespective of whether the mux delay takes place.

Figure 18:
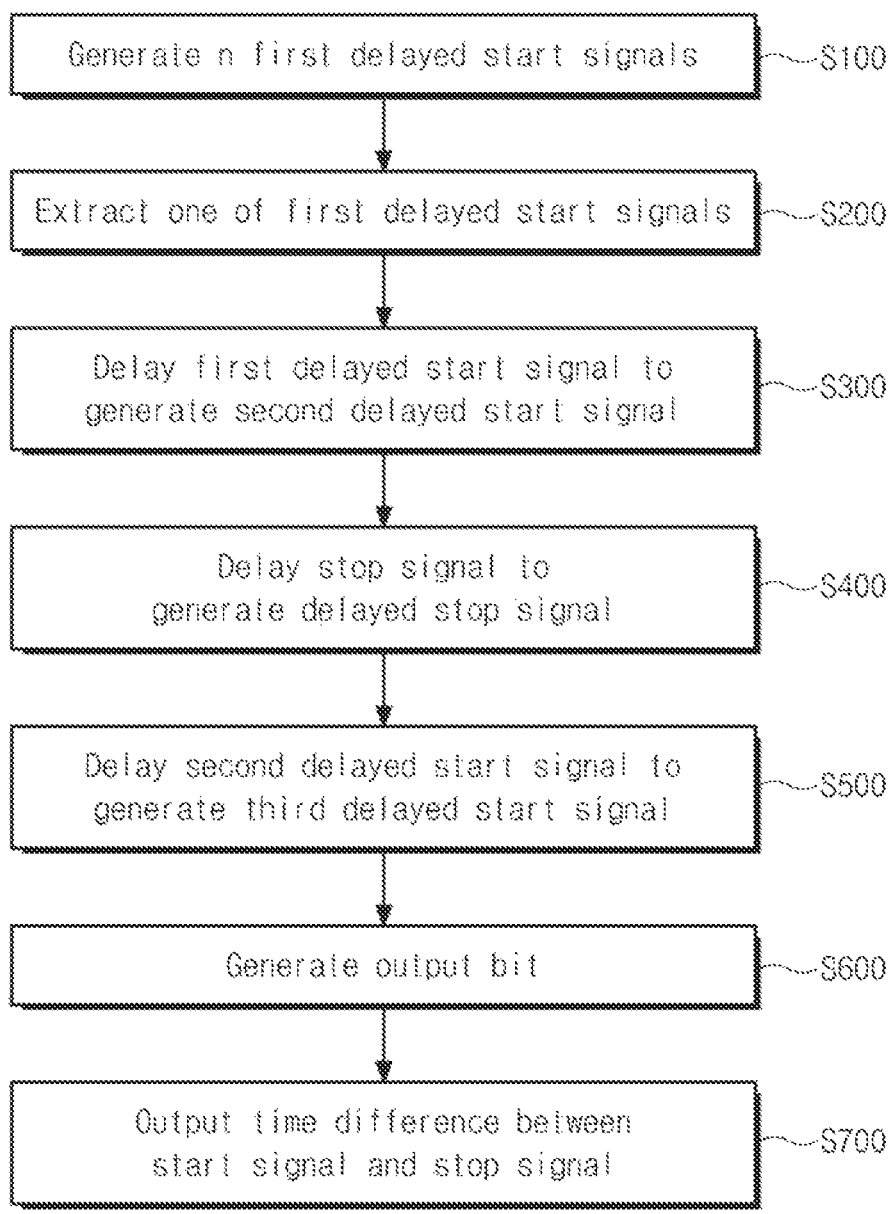
FIG. 18 is a flow chart of a time to digital conversion method according to an embodiment of the present invention.

FIG. 18 is a flow chart of a time to digital conversion method according to an embodiment of the present invention. As the time to digital conversion method as shown in FIG. 18, n first delayed start signals are generated in step S100. A time signal input to a coarse TDC is delayed in first time unit to generate the first delayed start signals and extracts one of the first delayed start signals in step S200. The first delayed start signal is determined according to an output bit according to a stop signal and the extracted first delayed start signal is further delayed to generate a second delayed start signal in step S300. The reason for generating the second delayed start signal is to secure linearity under a mux delay. The stop signal is delayed on a first delay line of a fine TDC in first time unit to generate a delayed stop signal in step S400. The second delayed start signal is transmitted to the fine TDC and further delayed on a second delay line of the fine TDC in second time unit to generate a third delayed start signal in step S500. An output bit is generated according to the logic levels of the third delayed start signal and the delayed stop signal in step S600 and the time difference between the start signal and the stop signal in step S700.

The delaying of the extracted first delayed start signal to generate the second delayed start signal is performed in time unit shorter than the first time unit, and the first time unit is longer than the second time unit.

It is obvious to an ordinary person skill in the art that the structures of the present invention may be modified or changed in various ways without departing from the scope or technical spirit of the present invention. When considering the above-described details, it is believed that the present invention includes the changes and modifications to the present invention if the changes and modifications to the present invention belong to the scope of the following claims and equivalents thereof.

INDUSTRIAL APPLICABILITY

The time to digital converter (TDC) according to an embodiment of the present invention may be applied to an analog to digital converter (ADC), a phase locked loop (PLL), a delay locked loop (DLL), an image sensor, a shape scanning device, a distance measurement device, etc.

What is claimed is:
1. A time to digital converter (TDC) comprising:
   a coarse TDC configured for receiving a start signal and a stop signal, delaying the first start signal in a first time unit to generate n first delayed start signals, measuring a time difference between the first delayed start signal and the stop signal in the first time unit, and generating second delayed start signals that are obtained by delaying the first delayed start signals in a time unit shorter than the first time unit, wherein n is an integer equal to or larger than 2; and
   a fine TDC configured for receiving and delaying the second delayed start signal generated from the coarse TDC and receiving the stop signal, and measuring a time difference between the second delayed start signal and the stop signal in a second time unit.

2. The time to digital converter of claim 1, wherein the coarse TDC comprises 2n delay cells, each delay cell of the 2n delay cells configured for delaying the start signal in a time unit of half of the first time unit and two neighboring delays cell configured for forming a pair of delay cells, and n coarse bit detectors that are connected between two neighboring pairs of delay cells and determine a value of an output bit according to logic levels of the first delayed start signal and the stop signal, and the second delayed start signal being output from each of nodes between the two delay cells in each pair of the delay cells.

3. The time to digital converter of claim 1, wherein the first time unit is larger than the second time unit.

4. The time to digital converter of claim 2, wherein when an output bit from a kth coarse bit detector of the n bit detectors is '1', a second delayed start signal further delayed in time unit of half of the first time unit from the kth first delayed start signal is provided to the fine TDC, wherein k≤n, where k is equal to or larger than 2.

5. The time to digital converter of claim 2, wherein the fine TDC comprises a first delay line and a second delay line each comprising n delay cells the first delay line being configured to delay the stop signal in a third time unit to generate n delayed stop, and the second delay line being configured to delay the second delayed start signal in a fourth time unit to generate n third delayed start signals.

6. The time to digital converter of claim 5, wherein the third time unit is larger than the fourth time unit and a time difference between the third time unit and the fourth time unit is the second time unit.

7. The time to digital converter of claim 5, wherein the fine TDC further comprises n fine bit detectors configured for generating an output bit according to logic levels of the delayed stop signal and the third delayed start signal.

8. The time to digital converter of claim 1, further comprising:
a first encoder configured for receiving an output bit from the coarse TDC and outputting a coarse time;
a second encoder configured for receiving an output bit from the fine TDC and outputting a fine time; and
an adder configured for outputting a time difference between the start signal and the stop signal by using the coarse time and the fine time.

9. A time to digital conversion method comprising:
(a) providing a start signal to a coarse TDC and delaying the start signal in a first time unit to generate a first delayed start signal;
(b) generating, at the coarse TDC, a first output bit according to logic levels of the first delayed start signal and a stop signal;
(c) delaying the first delayed start signal at the coarse TDC to generate a second delayed start signal;
(d) providing the stop signal to a first delay line of a fine TDC and delaying the stop signal in a third time unit to generate a delayed stop signal;
(e) providing the second delayed start signal to a second delay line of the fine TDC and delaying the second delayed start signal in a fourth time unit to generate a third delayed start signal; and
(f) generating a second output bit according to logic levels of the third delayed start signal and the delayed stop signal.

10. The time to digital conversion method of claim 9, wherein the delaying the first delayed start signal at the coarse TDC to generate the second delayed start signal comprises delaying the first delayed start signal in a unit of time shorter than the first time unit.

11. The time to digital conversion method of claim 9, wherein the third time unit in (d) is longer than the fourth time unit in (e).

12. A time to digital converter (TDC) comprising:
a coarse TDC;
a fine TDC coupled to the coarse TDC, wherein the coarse TDC includes 2n number of first delay cells; and a coarse bit detector, neighboring two first delay cells of the coarse TDC forming a pair of first delay cells, the coarse bit detector being connected between neighboring two pairs of first delay cells, and wherein the fine TDC comprising a first delay line includes n number of second delay cells; a second delay line comprising n number of third delay cells; and n number of fine bit detectors, each of the n number of fine bit detectors being connected to the second delay cell and the third delay cell, wherein n is equal to or larger than 2; and
a start signal being configured to input to a first delay cell of the 2n number of the first delay cells, a stop signal being configured to input to the coarse bit detector and the first delay line, a first delay cell of the second delay line of the find TDC being connected to a node between neighboring two first delay cells of each pair of the coarse TDC.

13. The time to digital converter of claim 12, wherein a time delayed by the second delay cell is longer than a time delayed by the third delay cell.

14. The time to digital converter of claim 12, wherein a difference between a time delayed by the second delay cell and a time delayed by the third delay cell is smaller than a time delayed by the first delay cell.

* * * * *